(12) United States Patent
Berens

(10) Patent No.: US 12,712,561 B2
(45) Date of Patent: Aug. 18, 2026

(54) OVERSAMPLING SINGLE-ENDED SAR DAC WITH REFERENCE RIPPLE CANCELLATION

(71) Applicant: NXP USA, Inc., Austin, TX (US)

(72) Inventor: Michael Todd Berens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 155 days.

(21) Appl. No.: 18/782,921

(22) Filed: Jul. 24, 2024

(65) Prior Publication Data

US 2026/0031829 A1 Jan. 29, 2026

(51) Int. Cl.

*H03M 1/12* (2006.01)
*H03M 1/46* (2006.01)
*H03M 1/06* (2006.01)
*H03M 1/60* (2006.01)

(52) U.S. Cl.

CPC ......... *H03M 1/1245* (2013.01); *H03M 1/462* (2013.01); *H03M 1/466* (2013.01); *H03M 1/06* (2013.01); *H03M 1/60* (2013.01)

(58) Field of Classification Search

CPC .... H03M 1/1245; H03M 1/462; H03M 1/466; H03M 1/06; H03M 1/60; H03M 1/0863; H03M 1/403; H03M 1/468

See application file for complete search history.

(56) References Cited

U.S. PATENT DOCUMENTS

| | | | | |
|---|---|---|---|---|
| 10,050,639 | B1 | 8/2018 | Berens et al. | |
| 10,476,513 | B1 * | 11/2019 | Chang | H03M 1/06 |
| 10,804,917 | B1 | 10/2020 | Chang et al. | |

OTHER PUBLICATIONS

Lai et al., "A 12-bit SAR ADC with Reference Voltage Ripple Suppression," 2021 IEEE International Symposium on Circuits and Systems (ISCAS); 4 pages.

Shen et al., "A 10-bit 120-MS/s SAR ADC with Reference Ripple Cancellation Technique," IEEE Journal of Solid-State Circuits, 2019; 13 pages.

* cited by examiner

*Primary Examiner* — Joseph J Lauture

(57) ABSTRACT

A method for reference ripple cancellation in an oversampled single-ended Successive Approximation Register (SAR) Analog to Digital Converter (ADC) includes sampling an input voltage onto a plurality of first capacitors of a switching Digital to Analog Converter (DAC) during a sampling phase. A first output of the switching DAC is compared to a second output of a non-switching DAC during a first conversion phase. A first digital code is generated from the comparison of the first output to the second output. The first digital code is applied to the non-switching DAC during a second conversion phase subsequent to the first conversion phase.

20 Claims, 6 Drawing Sheets

OVERSAMPLING SINGLE-ENDED SAR DAC WITH REFERENCE RIPPLE CANCELLATION

FIELD

This disclosure relates generally to an Analog to Digital Converter (ADC), and more specifically to the cancellation of ripple induced in a reference voltage of a Successive Approximation Register (SAR) ADC.

BACKGROUND

SAR ADCs are frequently used for medium to high resolution applications with low power consumption and a small form factor. The SAR ADC uses a binary search algorithm with a capacitive DAC to iteratively determine a digital representation of an analog value. The generation of a reference voltage for SAR ADCs is critical to good conversion performance because there is very little noise rejection from the reference to the ADC output.

Accordingly, the generation of the reference voltage has relied upon very large bypass capacitors or techniques that have high power consumption, both of which reduce the advantages that SAR ADCs offer. Mitigating techniques such as using DAC redundancy can allow higher ripple during portions of the conversion while DAC switching schemes can minimize switching current. However these techniques can be insufficient for high-resolution ADCs due to the large DAC capacitors that are required. Hence, there is a need to mitigate reference voltage ripple in single-ended SAR ADCs while maintaining the inherent advantages of low power consumption and small form factor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for reference ripple cancellation in an oversampled single-ended SAR ADC, by applying previous result codes obtained from an ADC conversion cycle to a non-switching DAC used in the single-ended ADC. Single ended SAR ADCs are a popular choice in microcontroller applications (e.g., for motor control), since many of the ADC inputs may be referenced to the same ground. In a single-ended SAR ADC (e.g., a noise shaping SAR ADC), embodiments of the ADC may take advantage of the slowly changing input signal, relative to the sampling frequency and conversion rate to substantially cancel the reference voltage ripple. Specifically, a previous ADC conversion result is applied to the non-switching DAC with the SAR ADC during the current ADC conversion to cancel the self-induced reference ripple, which occurs during the successive approximation of the input voltage being converted.

Figure 1:
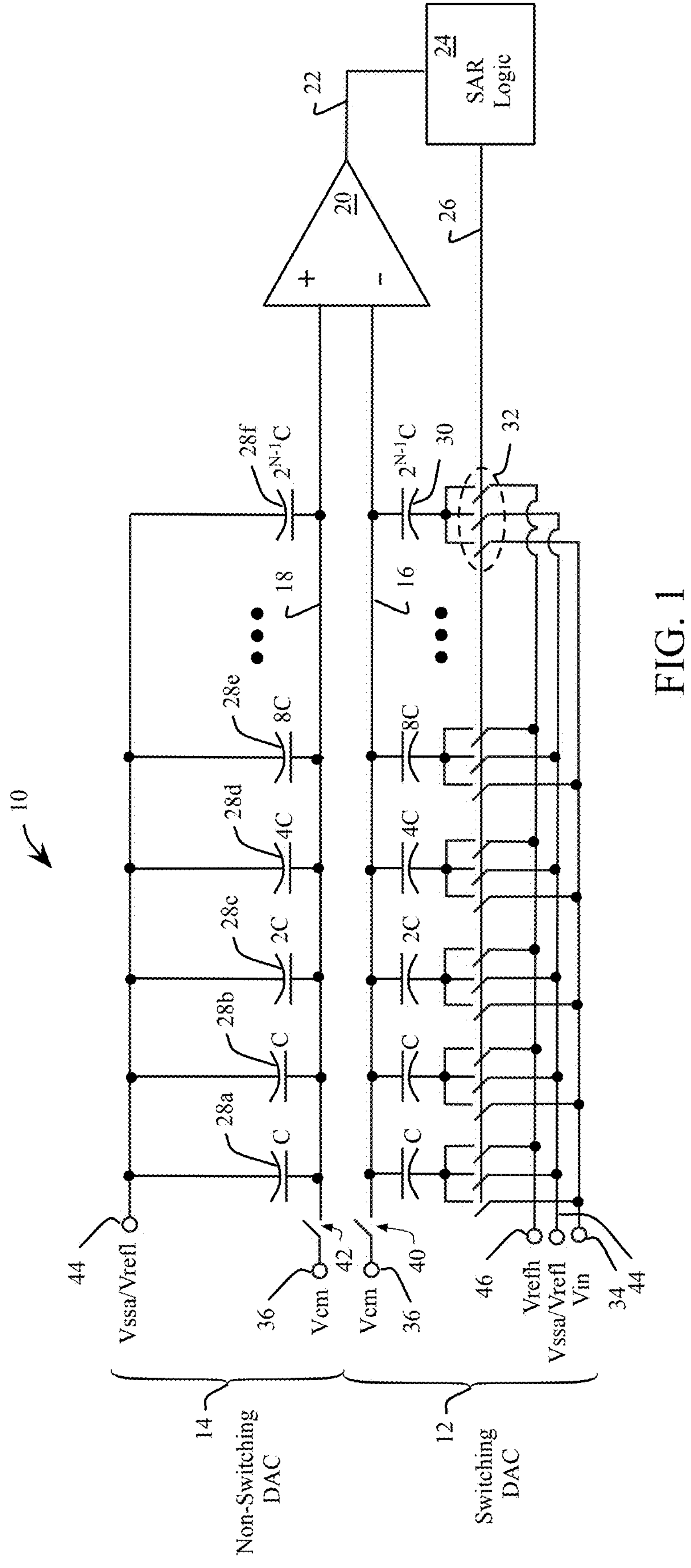
FIG. 1 is a schematic view of an embodiment of a SAR DAC.

FIG. 1 shows an embodiment 10 of a single-ended SAR DAC. The embodiment 10 includes a switching DAC 12 and a non-switching DAC 14. The switching DAC 12 may generate a first output 16. The non-switching DAC 14 may generate a second output 18. A comparator 20 may compare the first output 16 to the second output 18 to generate a comparison result 22, used by an SAR logic circuit 24. The SAR logic circuit 24 may generate a code 26. The non-switching DAC 14 includes a plurality of binary weighted capacitors 28*a*, 28*b*, 28*c*, 28*d*, 28*e* through 28*f* (generally 28). The capacitor 28*a* may represent a Least Significant Bit (LSB). The capacitor 28*f* may represent a Most Significant Bit (MSB). The switching DAC 12 may include the same values for each of a plurality of binary weighted capacitors as the capacitive value of the respective capacitor 28 of the non-switching DAC 14. For clarity, only the capacitor 30, representing the MSB of the switching DAC 12 is shown. For example, the capacitor 30 may have the same capacitance as the capacitor 28*f*. In some embodiments, the capacitors of the switching DAC 12 may be matched to the respective capacitors 28 of the non-switching DAC 14 with dynamic element matching, common centroid layout techniques and the like. Accordingly, an impedance of the non-switching DAC may be matched to an impedance of the switching DAC 12, within the limits of manufacturing and environmental tolerance, as well as typical process, voltage and temperature variations.

In one embodiment, the code 26 is a digital word including a plurality of bits, where the logical state of each bit determines whether a switch is closed or opened. In the embodiment 10, each capacitor of the switching DAC 12 is controlled by a group of switches 32 gated by the code 26 from the SAR logic circuit 24. During a sampling phase, the group of switches 32 may connect an input voltage 34 to a respective bottom plate of each capacitor of the switching DAC 12, while a respective top plate of each capacitor of the switching DAC 12 may be connected to a common-mode voltage 36 through a switch 40. The common-mode voltage 36 may be within a common-mode range of the comparator 20. During the sampling phase, a respective top plate of each capacitor 28 of the non-switching DAC 14 may be connected to the common-mode voltage 36 through a switch 42, while the respective bottom plate of each capacitor 28 may be connected to a low reference voltage 44. In one embodiment, the low reference voltage 44 may be the same as an analog ground ("Vssa").

During the determination of the code 26 by the SAR logic circuit 24 during a conversion (or "approximation") phase, a successive approximation algorithm may be executed, starting with the MSB and sequentially proceeding to the LSB, where initially a capacitor 30 may be connected to a high reference voltage 46, a comparison of the first output 16 to the second output 18 is made by the comparator 20, and then the (MSB) capacitor 30 is either left connected to the high reference voltage 46 or returned to a connection with the low reference voltage 44 depending upon the result of the comparison. In another embodiment, the input voltage 34 may be connected to each top plate of the capacitors of the switching DAC 12 through a single switch, and the respective bottom plates may be connected to a fixed voltage reference. Any mismatch in noise between the high reference voltage 46 and the low reference voltage 44 may couple disproportionately into the comparator 20, unless the input voltage 34 is close in value to the low reference voltage 44. Accordingly, a disproportional coupling of noise into the comparator 20 may result in bit errors, particularly in high-resolution ADCs.

Figure 2:
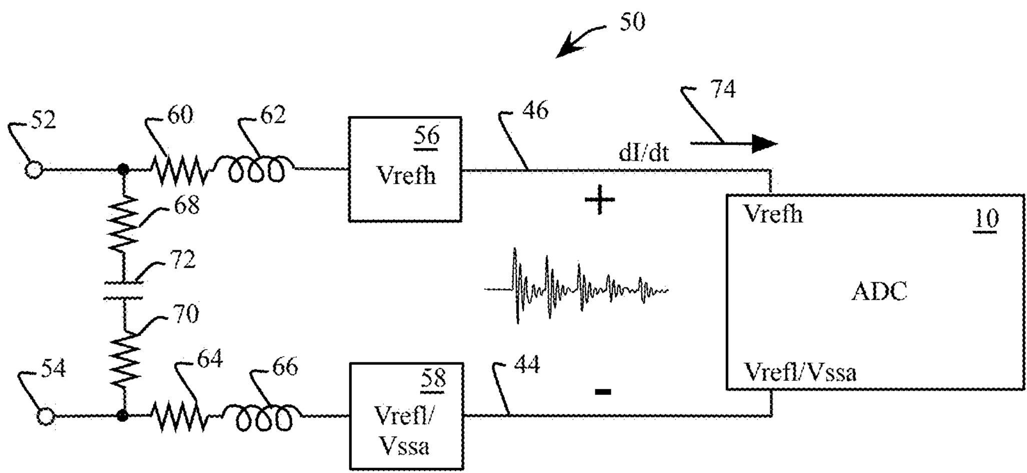
FIG. 2 is a schematic view of an embodiment of a DAC with ripple induced on reference voltages due to input parasitic elements.

FIG. 2 shows an embodiment 50 of the settling behavior of parasitic-induced ripple during sampling and conversion phases of an ADC. Due the charging and discharging of capacitors (e.g. the capacitors of the switching DAC 12), the SAR ADC 10 may create self-induced ripple on the high reference voltage 46 and the low reference voltage 44 during the successive approximation of the input voltage 34 during the conversion phase. For example, package pins 52 and 54 may be connected to a high reference voltage generator (or buffer) 56 and a low reference voltage generator (or buffer) 58 respectively. A parasitic resistance 60 and a parasitic inductance 62 may introduce ringing noise on the high reference voltage 46. Similarly, a parasitic resistance 64 and a parasitic inductance 66 may introduce ringing noise on the low reference voltage 44. Additional parasitic elements 68, 70 and 72 may also exist between the bond pads 52 and 54. Accordingly, an unbalanced ripple voltage 74 may be introduced into the ADC 10.

Figure 3:
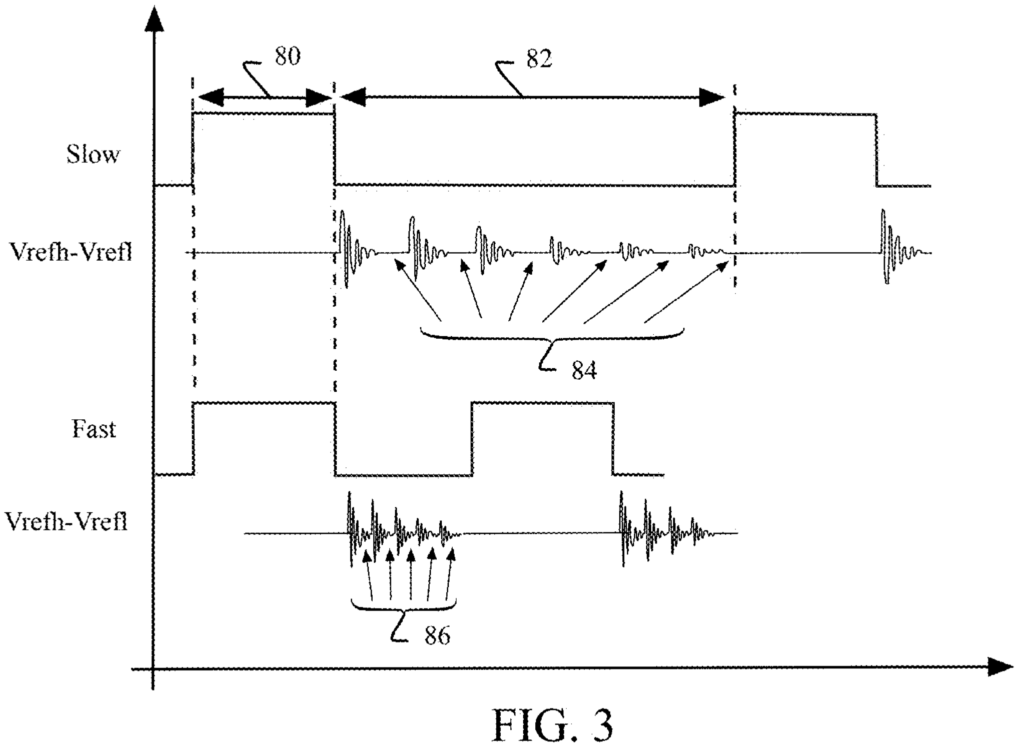
FIG. 3 is a graphical view of an embodiment of the settling behavior of parasitic-induced ripple during an ADC sample and conversion phases.

FIG. 3, with continued reference to FIG. 1 and FIG. 2, shows the settling behavior of the parasitic induced ripple voltage on an ADC sample 80 and a conversion phase 82. At a low conversion rate, the induced ripple may be allowed sufficient settling time before the comparator 20 decides the results of each step of the successive approximation (each decision point shown by a respective arrow in a group 84. In contrast, at a high conversion rate, the induced ripple does not sufficiently settle between successive approximations of the input voltage 34 as shown by the decision points in a group 86. Accordingly, bit errors may result from the SAR logic circuit 24 improperly determining whether a respective capacitor of the switching DAC 12 should be set to the high reference voltage 46 or the low reference voltage 44 based on an unsettled value of the reference voltages 44, 46 coupling onto DAC outputs 18,16.

Attempting to mitigate the ripple with large integrated capacitors or multiple bond-wires may be undesirable due to pin count and silicon area limitations. Traditionally, external decoupling capacitors have been used with values at least 2 to the power of N times bigger than the switching DAC 12 total capacitance which is determined by kT/C noise and matching considerations. At high conversion rates, the approach of using a large external decoupling capacitor is ineffective at suppressing ripple induced conversion errors due to parasitic elements and minimal settling time. DAC redundancy offers very little protection near critical LSB approximations. A unary (thermometer) DAC switching scheme minimizes DAC switching current but still allows for troublesome ripple for high-resolution ADCs. Furthermore, monotonic switching schemes are not compatible with single-ended SAR ADCs.

Figure 4:
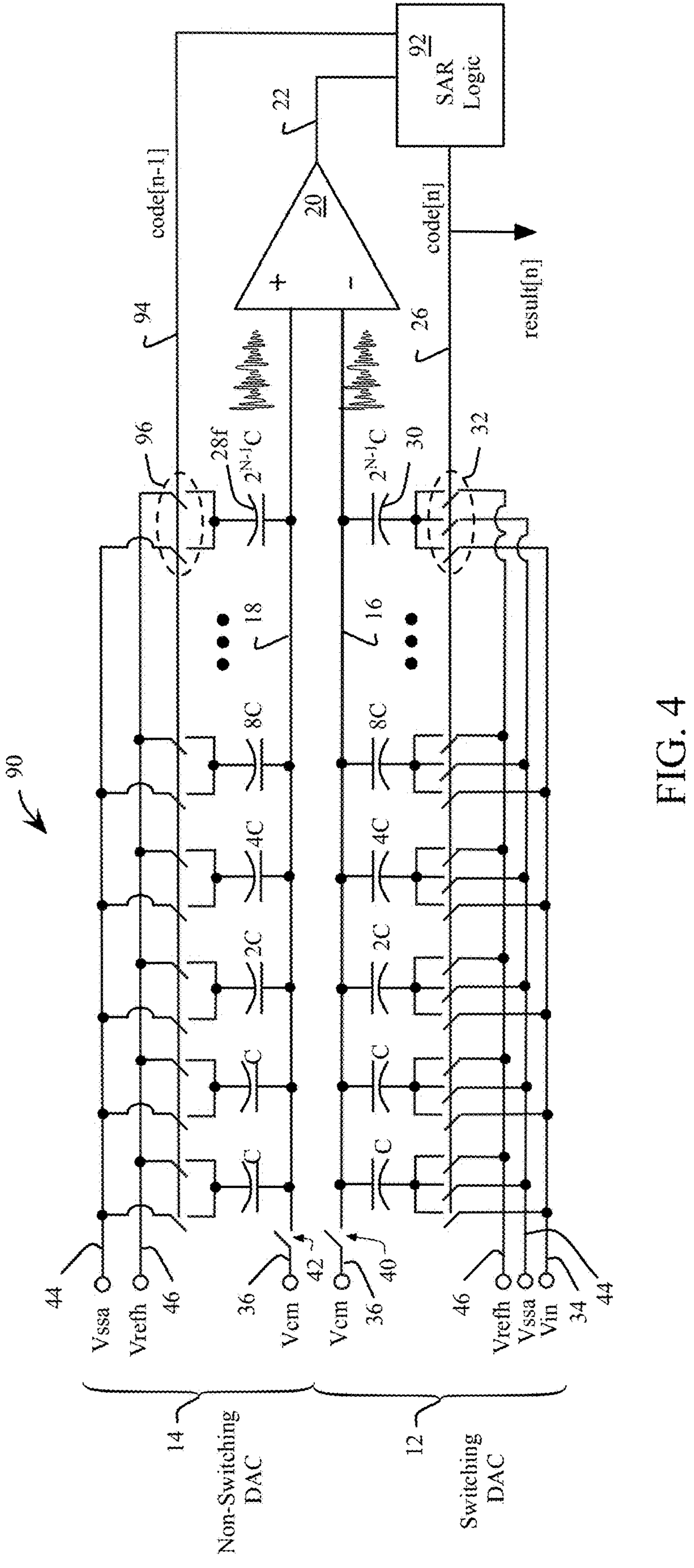
FIG. 4 is a schematic view of a single-ended SAR ADC with reference ripple cancellation, in accordance with an embodiment of the present disclosure.

FIG. 4 shows a single-ended SAR ADC with reference ripple cancellation, in accordance with an embodiment 90 of the present disclosure. The embodiment 90 includes a SAR logic circuit 92, which provides a previous code 94, from the immediately preceding successive approximation conversion, to each group of switches 96 controlling a respective capacitor 28*f* of the non-switching DAC 14. For clarity, only one group of switches 96 are labelled, however each capacitor 28 may be similarly controlled by a respective group of switches gated by the previous code 94.

In an oversampling SAR such as a noise-shaping SAR, the ADC sample rate may be significantly higher than the input signal bandwidth. This means that the input is not changing significantly between conversions. Accordingly, the next conversion result may be similar, (at least in terms of MSB results), to the previous result. Thus, we may apply the previous ADC result (e.g., the previous code 94) to the non-switching DAC 14 during both sample and approximation phases of the next conversion.

When we do this, the capacitances seen by both comparator inputs of the comparator 20 with respect to both the high reference voltage 46 and the low reference voltage 44 may be roughly equal when the ADC critical comparisons (e.g. the LSBs) are made. This allows the reference ripple to appear as common mode and be rejected by the comparator 20.

Because the output code is not changing too much between successive conversions, very little additional ripple will be introduced onto the reference voltages 44 and 46. In addition, the common-mode voltage 36 of the comparator 20 may not be adversely affected because the non-switching DAC 14 is not switched during the conversion.

Figure 5:
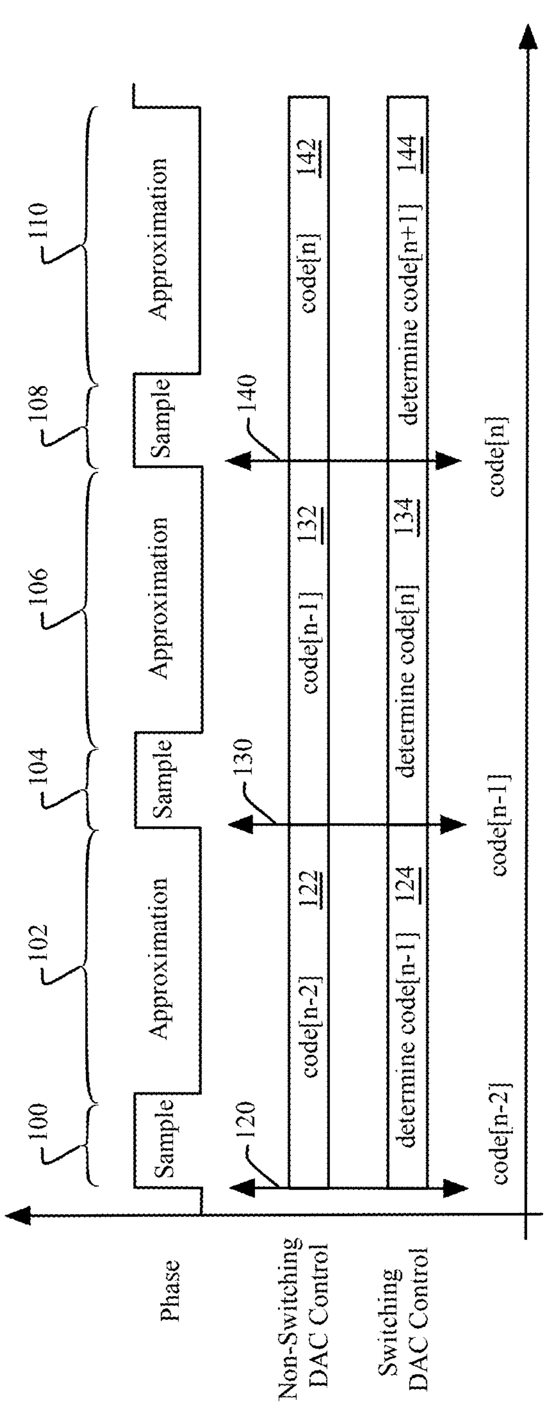
FIG. 5 is a graphical view of the timing of control signals of the SAR ADC with reference ripple cancellation, in accordance with an embodiment of the present disclosure.

FIG. 5 shows the timing of control signals of the SAR ADC 90 with reference ripple cancellation, in accordance with an embodiment of the present disclosure. With continued reference to FIG. 4, FIG. 5 shows three conversion cycles of the SAR DAC 90, including a sample 100 (of the input voltage 34) and an approximation 102, followed by a sample 104 and an approximation 106, followed by a sample 108 and an approximation 110. In one embodiment, during both the sample 100 and approximation 102 of the input voltage 34, a previously determined code result 120 is applied to the non-switching DAC 14 (as code [n−2]), while a binary search is performed on the switching DAC 12 using an SAR algorithm to determine a code [n−1] 124, stored by the SAR logic circuit 92 as the result code 130. Similarly, the determined code result 130 is applied to the non-switching DAC 14 (as code [n−1]), while a binary search is performed on the switching DAC 12 using an SAR algorithm to determine a code [n] 134, stored by the SAR logic circuit 92 as the result code 140. Subsequently, the determined code result 140 is applied to the non-switching DAC 14 (as code [n+1]), while a binary search is performed on the switching DAC 12 using an SAR algorithm to determine a code [n] 144.

Figure 6:
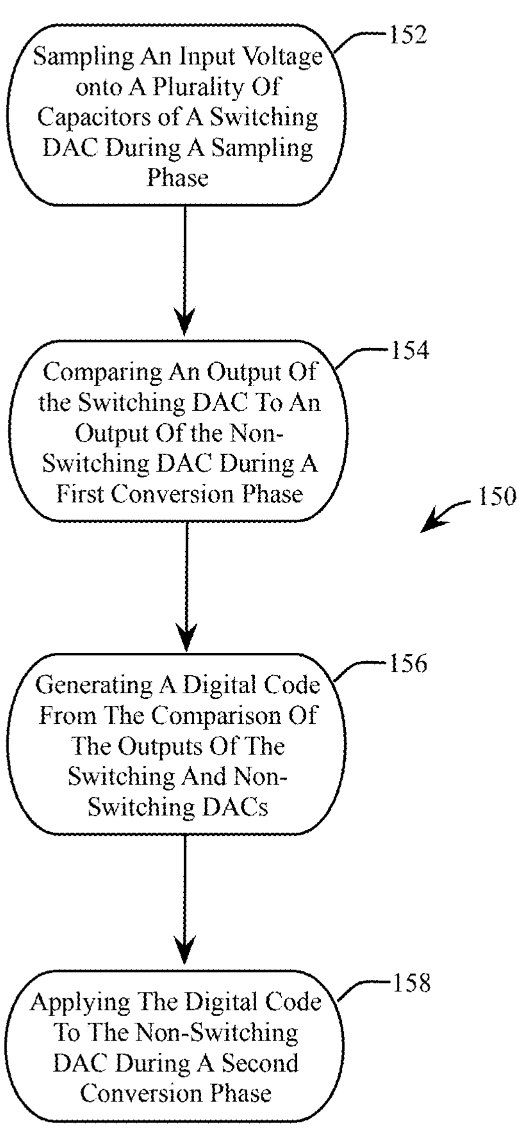
FIG. 6 is a flowchart representation of a method for reference ripple cancellation in an oversampled single-ended SAR ADC, in accordance with an embodiment of the present disclosure.

FIG. 6 shows an embodiment 150 of a method for reference ripple cancellation in an oversampled single-ended SAR DAC. With continued reference to FIG. 4, FIG. 5 and FIG. 6, at 152 an input voltage 34 is sampled onto a plurality of capacitors (e.g., capacitor 30) of a switching DAC 12 during a sampling phase 100, 104 or 108. At 154, an output 16 of the switching DAC 12 is compared to an output 18 of the non-switching DAC 14 during a first conversion phase 102, 106 or 110. At 156, a digital code 26 is generated from the comparison of the outputs of the switching 12 and non-switching 14 DACs. At 158, the digital code 94 is applied to the non-switching DAC 14 during a second conversion phase.

Figure 7:
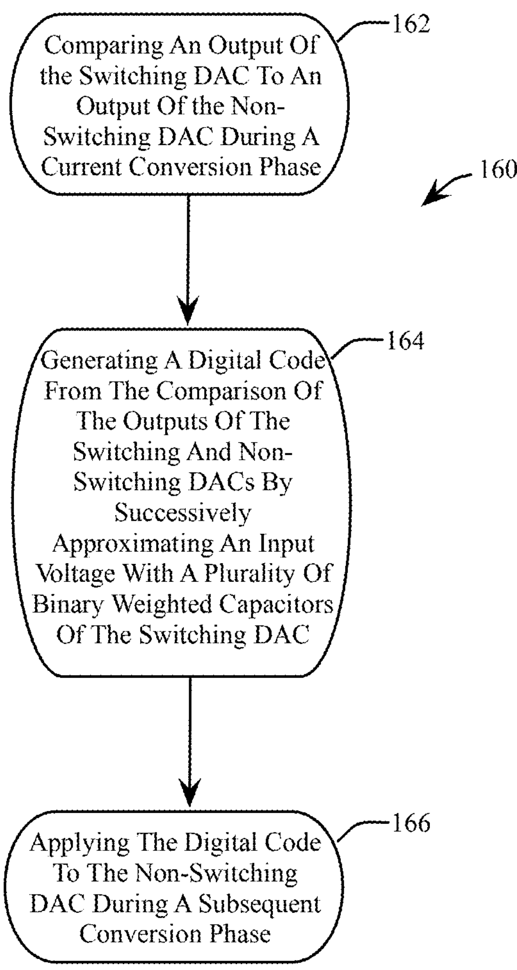
FIG. 7 is a flowchart representation of another method for reference ripple cancellation in an oversampled single-ended SAR ADC, in accordance with an embodiment of the present disclosure.

FIG. 7 shows an embodiment 160 of a method for reference ripple cancellation in an oversampled single-ended SAR DAC. With continued reference to FIG. 4, FIG. 5 and FIG. 7, at 162, an output 16 of the switching DAC 12 is compared to an output 18 of the non-switching DAC 14 during a first conversion phase 102, 106 or 110. At 164, a digital code 26 is generated from the comparison of the outputs 16 and 18 by successively approximating an input voltage 34 with a plurality of binary weighted capacitors (e.g. capacitor 30 being one of the plurality of capacitors representing the MSB), of the switching DAC 12. At 166, the digital code 94 is applied to the non-switching DAC 14 during a subsequent conversion phase.

As will be appreciated, at least some of the embodiments as disclosed include at least the following. In one embodiment, a method for reference ripple cancellation in an oversampled single-ended Successive Approximation Register (SAR) Analog to Digital Converter (ADC) comprises sampling an input voltage onto a plurality of first capacitors of a switching Digital to Analog Converter (DAC) during a first sampling phase. A first output of the switching DAC is compared to a second output of a non-switching DAC during a first conversion phase. A first digital code is generated from the comparisons of the first output to the second output. The first digital code is applied to the non-switching DAC during a second conversion phase subsequent to the first conversion phase.

Alternative embodiments of the method for reference ripple cancellation in an oversampled single-ended Successive Approximation Register (SAR) Analog to Digital Converter (ADC) include one of the following features, or any combination thereof. Sampling the input voltage comprises connecting the input voltage to a respective bottom plate of each of the first capacitors of the switching DAC and connecting a common-mode voltage to a respective top plate of each of the first capacitors, wherein the common-mode voltage is within a common-mode range of a comparator configured to compare the first output to the second output. Sampling the input voltage comprises connecting the input voltage to a respective top plate of each of the first capacitors of the switching DAC and connecting a fixed reference voltage to a respective bottom plate of each of the first capacitors. The first output and the second output are biased at a common-mode voltage of a comparator during the first sampling phase, wherein the comparator is configured to compare the first output to the second output. Sampling the input voltage comprises applying a previous digital code to the non-switching DAC during the sampling of the input voltage, and the previous digital code is generated in a previous conversion phase preceding the first conversion phase. The first digital code is applied to the non-switching DAC during a second sampling phase subsequent to the first sampling phase. Each respective digital code, sequentially generated by a SAR logic circuit during a respective conversion phase, is applied to the non-switching DAC during both a subsequent sampling and a subsequent conversion phase, being subsequent to the respective conversion phase. Generating the first digital code further comprises sequentially comparing the first output to the second output for each of the first capacitors switchably connected to one of a high reference voltage and a low reference voltage to successively approximate a digital value comprising a plurality of binary weighted bits representing the input voltage. Applying the first digital code to the non-switching DAC comprises switchably connecting each of a plurality of second capacitors of the non-switching DAC to one of a high reference voltage and a low reference voltage in response to a logic state of each bit of the first digital code, wherein each of the plurality of first capacitors of the switching DAC comprise a same respective capacitive value as the respective second capacitor of the non-switching DAC. Sampling the input voltage at a frequency higher than a bandwidth of the input voltage.

In another embodiment, an apparatus comprises a non-switching Digital to Analog Converter (DAC). A switching DAC is configured to sample an input voltage onto a plurality of first binary weighted capacitors during a first sampling phase. A comparator is configured to compare a first output of the switching DAC to a second output of a non-switching DAC during a first conversion phase. A Successive Approximation Register (SAR) logic circuit is configured to generate a digital code from the comparison of the first output to the second output, and to apply the digital code to the non-switching DAC during a second conversion phase subsequent to the first conversion phase.

Alternative embodiments of the apparatus include one of the following features, or any combination thereof. A first impedance of the non-switching DAC is matched to have a same impedance as a second impedance of the switching DAC. Each of the plurality of first binary weighted capacitors of the switching DAC comprise a same respective capacitive value as a respective second binary weighted capacitor of the non-switching DAC. The SAR logic circuit is configured to select a combination of the plurality of first binary weighted capacitors of the switching DAC to determine the digital code using a successive approximation algorithm during the first conversion cycle. The SAR logic circuit is configured to select a combination of a plurality of second binary weighted capacitors of the non-switching DAC with the digital code during the second conversion cycle.

In another embodiment, a method for reference ripple cancellation in an oversampled single-ended Successive Approximation Register (SAR) Analog to Digital Converter (ADC) comprises comparing a first output of a switching Digital to Analog Converter (DAC) to a second output of a non-switching DAC during a current conversion phase. A digital code is generated from the comparison of the first output to the second output by successively approximating an input voltage with a plurality of first binary weighted capacitors of the switching DAC, switchably connected to one of a high reference voltage and a low reference voltage. The digital code is applied to the non-switching DAC during a subsequent conversion phase, subsequent to the current conversion phase.

Alternative embodiments of the method for reference ripple cancellation in an oversampled single-ended Successive Approximation Register (SAR) Analog to Digital Converter (ADC) include one of the following features, or any combination thereof. The input voltage is sampled with the plurality of first binary weighted capacitors of the switching DAC. The input voltage is sampled at a frequency higher than a bandwidth of the input voltage. The digital code is applied to the non-switching DAC during a subsequent sampling phase, subsequent to the current conversion phase. Applying the digital code to the non-switching DAC comprises switchably connecting each of a plurality of second binary weighted capacitors of the non-switching DAC to one of the high reference voltage and the low reference voltage in response to a logic state of each bit of the digital code, wherein each of the plurality of first binary weighted capacitors of the switching DAC comprise a same respective capacitive value as the respective second binary weighted capacitor of the non-switching DAC.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for reference ripple cancellation in an oversampled single-ended Successive Approximation Register (SAR) Analog to Digital Converter (ADC) comprising:

sampling an input voltage onto a plurality of first capacitors of a switching Digital to Analog Converter (DAC) during a first sampling phase;

comparing a first output of the switching DAC to a second output of a non-switching DAC during a first conversion phase;

generating a first digital code from the comparison of the first output to the second output; and applying the first digital code to the non-switching DAC during a second conversion phase subsequent to the first conversion phase.

2. The method of claim 1 wherein sampling the input voltage comprises connecting the input voltage to a respective bottom plate of each of the first capacitors of the switching DAC and connecting a common-mode voltage to a respective top plate of each of the first capacitors, wherein the common-mode voltage is within a common-mode range of a comparator configured to compare the first output to the second output.

3. The method of claim 1 wherein sampling the input voltage comprises connecting the input voltage to a respective top plate of each of the first capacitors of the switching DAC and connecting a fixed reference voltage to a respective bottom plate of each of the first capacitors.

4. The method of claim 1 wherein the first output and the second output are biased at a common-mode voltage of a comparator during the first sampling phase, wherein the comparator is configured to compare the first output to the second output.

5. The method of claim 1 wherein sampling the input voltage comprises applying a previous digital code to the non-switching DAC during the sampling of the input voltage, and the previous digital code is generated in a previous conversion phase preceding the first conversion phase.

6. The method of claim 1 further comprising applying the first digital code to the non-switching DAC during a second sampling phase subsequent to the first sampling phase.

7. The method of claim 1 further comprising applying each respective digital code, sequentially generated by a SAR logic circuit during a respective conversion phase, to the non-switching DAC during both a subsequent sampling and a subsequent conversion phase, being subsequent to the respective conversion phase.

8. The method of claim 1 wherein generating the first digital code further comprises sequentially comparing the first output to the second output for each of the first capacitors switchably connected to one of a high reference voltage and a low reference voltage to successively approximate a digital value comprising a plurality of binary weighted bits representing the input voltage.

9. The method of claim 1 wherein applying the first digital code to the non-switching DAC comprises switchably connecting each of a plurality of second capacitors of the non-switching DAC to one of a high reference voltage and a low reference voltage in response to a logic state of each bit of the first digital code, wherein each of the plurality of first capacitors of the switching DAC comprise a same respective capacitive value as the respective second capacitor of the non-switching DAC.

10. The method of claim 1 further comprising sampling the input voltage at a frequency higher than a bandwidth of the input voltage.

11. An apparatus comprising:

a non-switching Digital to Analog Converter (DAC);

a switching DAC, configured to sample an input voltage onto a plurality of first binary weighted capacitors during a first sampling phase;

a comparator configured to compare a first output of the switching DAC to a second output of a non-switching DAC during a first conversion phase; and a Successive Approximation Register (SAR) logic circuit, configured to generate a digital code from the comparison of the first output to the second output, and to apply the digital code to the non-switching DAC during a second conversion phase subsequent to the first conversion phase.

12. The apparatus of claim 11 wherein a first impedance of the non-switching DAC is matched to have a same impedance as a second impedance of the switching DAC.

13. The apparatus of claim 11 wherein each of the plurality of first binary weighted capacitors of the switching DAC comprise a same respective capacitive value as a respective second binary weighted capacitor of the non-switching DAC.

14. The apparatus of claim 11 wherein the SAR logic circuit is configured to select a combination of the plurality of first binary weighted capacitors of the switching DAC to determine the digital code using a successive approximation algorithm during the first conversion cycle.

15. The apparatus of claim 11 wherein the SAR logic circuit is configured to select a combination of a plurality of second binary weighted capacitors of the non-switching DAC with the digital code during the second conversion cycle.

16. A method for reference ripple cancellation in an oversampled single-ended Successive Approximation Register (SAR) Analog to Digital Converter (ADC) comprising:

comparing a first output of a switching Digital to Analog Converter (DAC) to a second output of a non-switching DAC during a current conversion phase;

generating a digital code from the comparison of the first output to the second output by successively approximating an input voltage with a plurality of first binary weighted capacitors of the switching DAC, switchably connected to one of a high reference voltage and a low reference voltage; and applying the digital code to the non-switching DAC during a subsequent conversion phase, subsequent to the current conversion phase.

17. The method of claim 16 further comprising sampling the input voltage with the plurality of first binary weighted capacitors of the switching DAC.

18. The method of claim 16 further comprising sampling the input voltage at a frequency higher than a bandwidth of the input voltage.

19. The method of claim 16 further comprising applying the digital code to the non-switching DAC during a subsequent sampling phase, subsequent to the current conversion phase.

20. The method of claim 16 wherein applying the digital code to the non-switching DAC comprises switchably connecting each of a plurality of second binary weighted capacitors of the non-switching DAC to one of the high reference voltage and the low reference voltage in response to a logic state of each bit of the digital code, wherein each of the plurality of first binary weighted capacitors of the switching DAC comprise a same respective capacitive value as the respective second binary weighted capacitor of the non-switching DAC.

* * * * *